MONOSTABLE MULTIVIBRATOR

Filed Sept. 27, 1957

Inventor:
Edward F. Carr,
by [signature]
Attorney.

United States Patent Office 2,952,784

Patented Sept. 13, 1960

2,952,784

MONOSTABLE MULTIVIBRATOR

Edward F. Carr, Fort Wayne, Ind., assignor to International Telephone and Telegraph Corporation Filed Sept. 27, 1957, Ser. No. 686,705

16 Claims. (Cl. 307—88.5)

This invention relates to monostable multivibrator circuits, i.e., circuits for producing a single output pulse responsive to a single input pulse or signal, and more particularly to a monostable multivibrator circuit for providing a square output pulse of predetermined duration.

There are applications in the electronics field where it is desirable to initiate an operation a predetermined period of time after the occurrence of a previous operation; in certain radar applications, it is desirable to delay initiation of the PPI sweep for a predetermined period of time after the transmitted pulse. It is therefore desirable to provide a delay generator circuit which will provide an output signal usable for initiating a subsequent operation a predetermined period of time after an input or triggering pulse. A monostable multivibrator circuit, i.e., a circuit which provides a single output pulse in response to a single triggering pulse, may be used as such a delay generator since the trailing side of the output pulse may be utilized for initiating the desired subsequent operation, i.e., in the case of radar to start the sweep.

The present-day trend in electronic equipment, particularly that intended for airborne use, is toward miniaturization in order to secure compactness and minimum weight and it is therefore desirable that the monostable multivibrator circuit incorporate transistors rather than vacuum tubes. It is, however, essential that the output pulse of the monostable multivibrator circuit have a fixed predetermined duration in each instance; previous transistorized monostable multivibrator or relaxation oscillator circuits provided an output pulse, the duration of which was dependent upon the particular transistor employed, i.e., substitution of a different transistor in the circuit would provide an output pulse having a different duration. Furthermore, transistor characteristics can change radically with temperature; in prior circuits this also could cause a change in pulse duration. It is therefore particularly desirable to provide a transistorized monostable multivibrator circuit providing a square output pulse of fixed predetermined duration, the circuit being insensitive to the particular transistors employed, or to temperature change, i.e., which provides the same duration of output pulse regardless of the particular transistor used or the ambient temperature.

It is therefore an object of this invention to provide an improved monostable multivibrator circuit.

Another object of this invention is to provide an improved transistorized monostable multivibrator circuit.

A further object of this invention is to provide an improved monostable multivibrator circuit having a square output pulse of fixed predetermined duration.

Yet another object of this invention is to provide an improved transistorized monostable multivibrator circuit having a square output pulse of predetermined fixed duration which is insensitive to the particular transistors employed in the circuit.

In accordance with the broader aspects of my invention,

I provide a first valve device, preferably a junction transistor having its control element and another element connected in series with a tuned inductance-capacitance (L—C) circuit across the source of input pulses. The tuned circuit is arranged to have a natural period twice the desired duration of the output pulse and the first valve device is arranged normally to be conductive and to be rendered non-conductive in response to an input pulse whereby the tuned circuit is shocked into oscillation, i.e., caused to "ring." A second valve device, preferably another junction transistor, is provided having its control element connected to the tuned circuit by half-wave rectifying means and an output circuit is connected to a second element of the second valve device. This second valve device is arranged normally to be non-conductive and to be rendered conductive responsive to and during the first half cycle of the oscillation or ringing of the tuned circuit, thereby impressing across the output circuit a square voltage pulse having a duration half the normal period of the tuned circuit.

The above mentioned and other features and objects of this invention and the manner of attaining them will become more apparent, and the invention itself will be best understood by reference to the following description of an embodiment of the invention taken in conjunction with the accompanying drawings, wherein.

Figure 1:
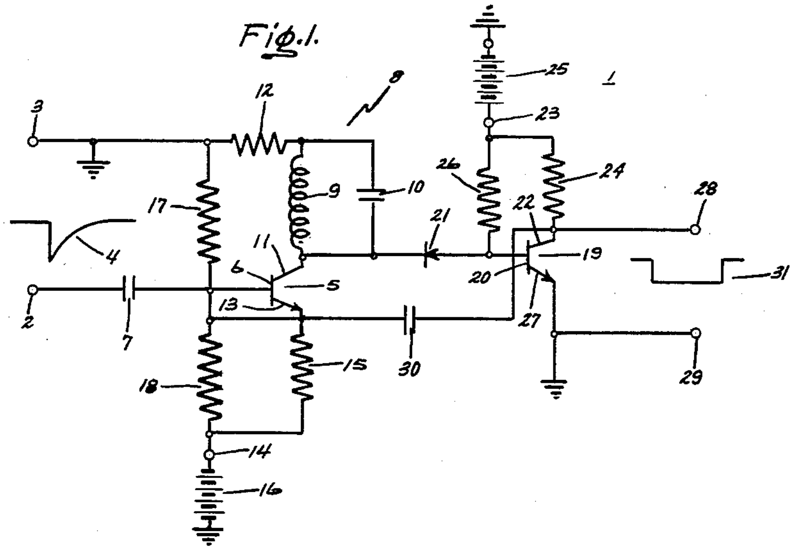
Fig. 1 is a schematic illustration showing one embodiment of my invention.

Referring now to Fig. 1, my improved monostable multivibrator circuit, generally identified as 1, is provided with a pair of input terminals 2 and 3 respectively adapted to be connected to a source of input or triggering pulses having a configuration as shown at 4; for best operation of the circuit 1, the triggering pulses 4 should have a sharply ascending wave front and a slow decay of the trailing edge. A first junction transistor 5 is provided having its base 6 connected to the input terminal 2 by a suitable blocking capacitor 7. A parallel tuned circuit 8 is provided comprising a suitable inductance 9 and parallel connected capacitor 10, the tuned circuit 8 being connected between the collector 11 of the transistor 5 and the other input terminal 3, a resistor 12, preferably being connected in series between the input terminal 3 and the tuned circuit 8 if the inductance 9 does not have sufficient series resistance. The input terminal 3 may also be grounded as shown.

The emitter 13 of the transistor 5 is connected to a terminal 14 by means of a suitable resistor 15. A suitable source of negative direct current potential, such as the negative side of battery 16, is connected to terminal 14 with the positive side of the battery 16 being grounded, as shown. A suitable resistor 17 is connected across the input terminal 3 and the base 6 of transistor 5 while another suitable resistor 18 is connected across the base 6 of transistor 5 and terminal 14 as shown; the resistors 15, 17 and 18 serving to set the operating point of the transistor 5 and to stabilize that operating point with temperature variations.

A second junction transistor 19 is provided having its base 20 connected to the collector 11 of transistor 5 by means of a half-wave rectifier 21. The collector 22 of transistor 19 is connected to terminal 23 by means of load resistor 24, the terminal 23 being adapted to be connected to a suitable positive direct current potential source, for example, battery 25 having its positive terminal connected to terminal 23 and its negative terminal connected to ground as shown. A suitable resistor 26 connects terminal 23 to the base 20 of transistor 19. The emitter 27 of transistor 19 is connected to ground as shown and output terminals 28 and 29 are respectively connected to the collector 22 and emitter 27 of the transistor 19. A suitable capacitor 30 is connected between the collector 22 of the transistor 19 and the base 6 of transistor 5 to provide a feed-back circuit to be described more fully hereinafter.

The operation of the circuit of Fig. 1 will now be described. It will be observed that with the input terminal 3 grounded and with the terminal 14 to which the emitter 13 of transistor 5 is connected in turn connected to the negative side of battery 16, transistor 5 will normally be conductive. When, however, a negative input pulse 4 is applied across the input terminals 2 and 3, the base 6 of transistor 5 will be driven sufficiently negative so that transistor 5 will stop conducting and the tuned circuit 8 will be shocked into oscillation or caused to "ring." The constants of the inductance 9 of the capacitor 10 forming the tuned circuit 8 are chosen so that the tuned circuit has a natural period twice the desired duration of the output pulse. It will now be observed that under normal conditions, i.e., prior to the appearance of the input or triggering pulse 4 across the input terminals 2 and 3, and with the half-wave rectifier or diode 21 polarized as shown, a current will flow from the positive terminal of battery 25 through resistor 26, rectifier 21 and the conducting transistor 5. With the voltages of battery 25 and battery 16 and the resistances of resistors 26, 15 and 18 properly chosen, the potential of the base 20 of transistor 19 and of the collector 11 of transistor 5 will be slightly negative so that under these conditions transistor 19 is non-conductive. When, however, the input pulse 4 is impressed on the input terminals 2 and 3 causing transistor 5 to be non-conductive and tuned circuit 8 to be shocked into oscillation, the collector 11 of transistor 5 will follow the potential of the tuned circuit 8 as it rises during its first half cycle of oscillation and rectifier 21 will thus block the further flow of current. The potential of the base 20 of transistor 19 will thus immediately become positive by virtue of its connection between ground and the positive terminal of battery 25 and thus transistor 19 becomes conductive at this point. It will now be observed that when transistor 19 is non-conductive, the potential of output terminal 28 will be essentially that of the positive terminal of battery 25. When the transistor 19 becomes conductive, however, current flows from the positive terminal of battery 25 through load resistor 24 to ground and thus the potential of the output terminal 28 is reduced by the amount of the voltage drop across resistor 24, thus providing the inverse square output voltage configuration 31 as shown.

When the voltage wave of the first half cycle of oscillation of the tuned circuit 8 falls to zero and begins to go negative, the potential of collector 11 of transistor 5 will again become negative, thus allowing rectifier 21 to conduct and causing the potential of base 20 of transistor 19 to become negative, thus causing transistor 19 suddenly to become non-conductive to terminate the output pulse 31 as shown. It is thus seen that the output pulse 31 has the same duration as half the natural period, i.e., one-half cycle of the resonant frequency of the tuned circuit 8. The capacitor 30 provides a feed-back connection which keeps the base 6 of the transistor 5 negative during the first positive half cycle of oscillation of the tuned circuit 8. As indicated above, when the voltage wave of the tuned circuit 8 goes negative after the first half cycle of oscillation, the collector 11 of the transistor 5 also becomes negative, the rectifier 21 begins to conduct and the base 20 of transistor 19 also becomes negative to cut off transistor 19. Under these conditions, the collector 22 of transistor 19 now becomes positive and by virtue of the feed-back connection through capacitor 30, the base 6 of transistor 5 also becomes positive and transistor 5 thus again becomes conductive. It will now be seen that the duration of the output pulse 31 is determined by the natural frequency of the tuned circuit 8 and will not be altered by substitution of different transistors in the circuit.

In the circuit of Fig. 1, the transistor 5 may be a 951 junction transistor, the transistor 19 may be a 904 junction transistor, and the rectifier 21 may be a 1N198 diode. The battery 16 may provide a potential of 22 volts thus establishing the terminal 14 at a potential of minus 22 volts while the battery 25 may likewise provide the same potential thus establishing the terminal 23 at a potential of plus 22 volts. The remaining components of the circuit of Fig. 1 may have the values illustrated below:

| | | |
|---|---|---|
| Capacitor 7 | mfd | .005 |
| Resistor 17 | ohms | 20,000 |
| Resistor 12 | do | 200 |
| Resistor 18 | do | 51,000 |
| Resistor 15 | do | 560 |
| Inductance 9 | millihenries | 50 |
| Capacitor 10 | mmfd | 2,200 |
| Capacitor 30 | mfd | .1 |
| Resistor 26 | ohms | 10,000 |
| Resistor 24 | do | 82,000 |

Figures 2, 3:
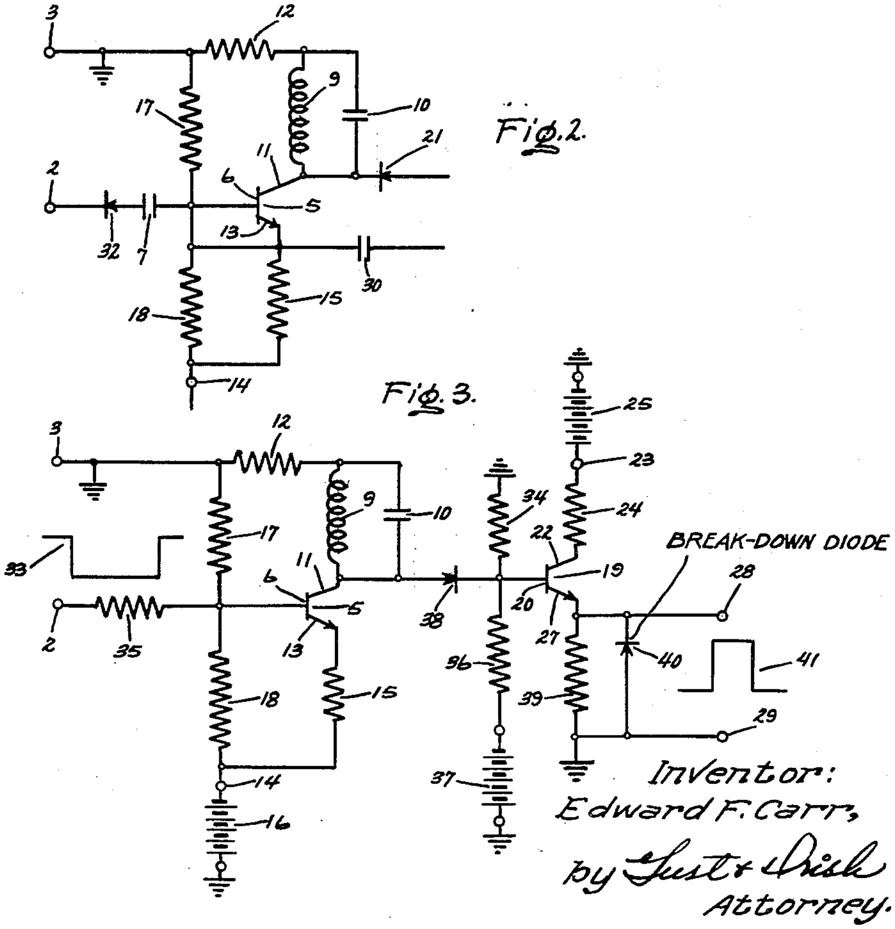
Fig. 2 is a fragmentary schematic illustration showing a modification of the circuit of Fig. 1.
Fig. 3 is another schematic illustration showing a further modification of my invention.

It will be seen in Fig. 1 that when transistor 19 is conducting and the output pulse 31 is impressed across the output terminals 28 and 29, the impedance of the source of the input pulse 4 also appears across the output terminals 28 and 29. In order to disconnect the base 6 of the input transistor 5 from the pulse source when the base 11 goes negative so that the collector 22 of the output transistor 19 no longer sees the impedance of the pulse source, Fig. 2 shows a modification of the circuit of Fig. 1, in which like elements are indicated by like reference numerals, and in which a half wave rectifier or diode 32 is connected in series with capacitor 7. The rectifier 32 effectively disconnects the base 6 of the transistor 5 and the collector 22 of transistor 19 from the pulse source when the base is negative and transistor 19 is thus turned on so that the impedance of the source of the input pulses 4 does not appear across the output terminals 28 and 29.

If the input or triggering pulse is longer than the desired duration of the output pulse, the feed-back circuit of Fig. 1 may be eliminated as shown in Fig. 3, in which like elements again are indicated by like reference numerals, and in which a slightly different circuit connection is shown. Here, the emitter 13 of the input transistor 5 is again connected to the negative side of the source of direct current potential 16, which may in this case be minus 50 volts and transistor 5 is thus normally conductive in the absence of the negative triggering pulse 33 which may, for example, have a negative value of 10 volts. It is seen that a resistor 35 is connected in series between input terminal 2 and the base 6 of the transistor 5 and that the collector 22 of the output transistor 19 is again connected to the positive side of a source of direct current potential 25, which in this case may be plus 25 volts. In this circuit, however, a resistor 34 connects the base 20 of the output transistor 19 to ground while another resistor 36 connects the base 20 of output transistor 19 to the negative side of a source of direct current potential 37, which may be the battery 37 providing a potential of 50 volts with the positive side of the battery 37 being grounded as shown. Here, the base 20 of the output transistor 19 is connected to the collector 11 of the input transistor 5 by a half wave rectifier or diode 38 polarized oppositely from the polarization of the rectifier 21 of Fig. 1. It will further be seen that a resistor 39 connects the emitter 27 of the output transistor 19 to ground with the output terminals 28 and 29 being connected across the resistor 39 and with a breakdown diode 40 being connected across the output terminals 28 and 29.

It will be recalled that the collector 11 of the input transistor 5 is normally slightly negative and it will be observed that by virtue of the connection of resistors 34 and 36 to the negative side of battery 37, the base 20 of transistor 19 will also be slightly negative; rectifier 38, therefore, normally is non-conducting and transistor 19 likewise is normally non-conducting. When the input pulse 33 is impressed across the terminals 2 and 3, however, as in the case of the circuit of Fig. 1, transistor 5 becomes non-conducting and the tuned circuit 8 is shocked into oscillation; the collector 11 of the transistor 5 thus follows the potential of the tuned circuit 8 during its first positive half cycle of oscillation causing rectifier 38 to conduct and the base 20 of transistor 19 to become positive, thereby causing the transistor 19 to become conductive. Current will now flow from the positive terminal of battery 25 through resistor 24 and transistor 19 through the load resistor 39 to ground to provide the square output voltage pulse across the output terminals 28 and 29. If it is desired to limit the value of this pulse, a breakdown diode 40 may be connected across the resistor 39 as shown.

When the voltage of collector 11 of the input transistor 5 goes negative as the tuned circuit 8 goes into its first negative half cycle. The rectifier 38 will stop conducting and the base 20 of the output transistor 19 will again become negative, thereby turning off the transistor 19 and terminating the output voltage pulse 41; it will again be seen that the duration of the output voltage pulse 41 is half the natural period of tuned circuit 8. The input pulse 33 will not have terminated at the end of the output pulse 41, the base 6 of the input transistor 5 will still be negative and it is thus unnecessary to provide the feed-back capacitor 30.

In the circuit of Fig. 3, transistors 5 and 19 may again be 951 and 904 junction transistors respectively with the half wave rectifier 38 being a 6552 diode and with the breakdown diode 40 being a 653C9 diode. Here, the remaining components may have the values indicated below.

| | | |
|---|---|---|
| Resistor 12 | ohms | 220 |
| Resistor 17 | do | 8,200 |
| Resistor 18 | do | 13,000 |
| Resistor 15 | do | 220 |
| Inductance 9 | millihenries | 50 |
| Capacitor 10 | microfarads | .022 |
| Resistor 34 | ohms | 10,000 |
| Resistor 36 | do | 200,000 |
| Resistor 24 | do | 2,000 |
| Resistor 39 | do | 10,000 |

It will now be seen that I have provided an improved monostable multivibrator circuit which provides a single square output voltage pulse in response to an input pulse having a sharply ascending wave front, the output pulse having a fixed predetermined duration determined by the natural frequency of the tuned circuit rather than by the characteristics of the individual transistors in the circuit. This circuit is also stable in pulse duration with temperature change if the inductance and the capacitance employed in the tuned circuit are of the type which have stable values regardless of temperature, such components are commercially available. It will also be readily apparent that with my improved circuit, the duration of the output pulse may be either longer or shorter than the input pulse. It will further be observed that vacuum tubes may be substituted for the transistors 5 and 19, however, my circuit is especially adapted for use with transistors.

While I have described above the principles of my invention in connection with specific apparatus, it is to be clearly understood that this description is made only by way of example and not as a limitation to the scope of my invention.

What is claimed is:

1. A monostable multivibrator circuit for providing one square output voltage pulse of predetermined fixed duration in response to one input voltage pulse having a sharply ascending wave front comprising: an input circuit adapted to be connected to a source of said input pulses; a first valve device having a control element connected to said input circuit; tuned circuit means connecting a second element of said first valve device to said input circuit; a source of potential serially connected with said second element and a third element of said first valve device; said tuned circuit means having a natural period twice the duration of said output pulse; means for biasing said first valve device to be normally conductive and to be rendered non-conductive in response to said input pulse whereby said tuned circuit means is shocked into oscillation; a second valve device having a control element; an output circuit connected to a second element of said second valve device; a source of potential serially connected with said second element and a third element of said second valve device; and means including half-wave rectifying means having a direct current coupling between said second valve device control element and said tuned circuit means for biasing said second valve device to be normally non-conductive and to be rendered conductive responsive to and during the first half-cycle of said oscillation of said tuned circuit means thereby to impress across said output circuit a square voltage pulse having a duration half the said normal period of said tuned circuit.

2. The combination of claim 1 further comprising a feedback circuit connected between said output circuit and said input circuit for maintaining said first valve device non-conductive during said output pulse.

3. The combination of claim 1 further comprising half-wave rectifying means connected in series in said input circuit so that said pulse source is disconnected from said first valve device when the same is rendered non-conductive whereby the impedance of said pulse source is not included in said output circuit.

4. The combination of claim 1 further comprising voltage limiting means connected across said output circuit for limiting the voltage of said output pulse.

5. A monostable multivibrator circuit for providing one square output voltage pulse of predetermined fixed duration in response to one input voltage pulse having a sharply ascending wave front comprising: an input circuit adapted to be connected to a source of said input pulses; a first valve device having a control element; a parallel connected tuned circuit having a natural period twice the duration of said output pulse; said control element and second element of said first valve device being serially connected with said tuned circuit across said input circuit; a source of negative direct current potential and circuit connections for impressing said negative potential source on a third element and said control element of said first valve device for biasing the same whereby said first valve device is normally conductive and is rendered non-conductive responsive to said input pulse whereby said tuned circuit is shocked into oscillation; a second valve device having a control element; an output circuit connected across second and third elements of said second valve device; a source of positive direct current potential; and circuit connections including half-wave rectifying means having a direct current coupling between said second valve device control element and said second element of said first valve device and further including serially connected means for impressing said positive potential source on said control and second elements of said second valve device for biasing the same whereby said second valve device is normally non-conductive and is rendered conductive responsive to and during the first half-cycle of said oscillation of said tuned circuit thereby to impress across said output circuit a square voltage pulse having a duration half said normal period of said tuned circuit.

6. The combination of claim 5 wherein said half-wave rectifying means is polarized to pass current from said source of positive direct current potential when said first valve device is conductive whereby said second valve device is rendered normally non-conductive, said half-wave rectifying means blocking said current flow therein when said tuned circuit begins its first half-cycle of oscillation whereby said second valve device is rendered conductive.

7. A monostable multivibrator circuit for providing one square output voltage pulse of predetermined fixed duration in response to one input voltage pulse having a sharply ascending wave front comprising: an input circuit adapted to be connected to a source of input pulses; a first valve device having a control element; a parallel connected tuned circuit having a natural period twice the duration of said output pulse; said control element and second element of said first valve device being serially connected with said tuned circuit across said input circuit; a first source of negative direct current potential and circuit connections for impressing said first negative potential source on a third element and said control element of said first valve device for biasing the same whereby said first valve device is normally conductive and is rendered non-conductive responsive to said input pulse whereby said tuned circuit is shocked into oscillation; a second valve device having a control element; an output circuit connected to a second element of said second valve device; a source of positive direct current potential and a second source of negative direct current potential; and circuit connections including half-wave rectifying means having a direct current coupling between said second valve device control element and said second element of said first valve device for impressing said positive potential source on a third element of said second valve device and said second negative potential source on said control element of said second valve device; said half-wave rectifying means being polarized to block current when said first valve device is conductive whereby said second valve device is rendered normally non-conductive, said half-wave rectifying means passing current when said tuned circuit begins its first half-cycle of oscillation whereby said second valve device is rendered conductive, thereby impressing across said output circuit a square voltage pulse having a duration half the normal period of said tuned circuit.

8. The combination of claim 7 further comprising a break-down diode connected across said output circuit for limiting the voltage of said output pulse.

9. The combination of claim 8 further comprising a capacitor connected between the collector of said second transistor and the base of said first transistor thereby forming a feedback circuit for maintaining said first transistor non-conductive during said output pulse.

10. A monostable multivibrator circuit for providing one square output voltage pulse of predetermined fixed duration in response to one input voltage pulse having a sharply ascending wave front comprising: an input circuit adapted to be connected to a source of said input pulses; a first valve device having a control element connected to said input circuit; tuned circuit means connecting a second element of said first valve device to said input circuit; a first source of direct current potential serially connected with said second element and a third element of said first valve device; said tuned circuit means having a natural period twice the duration of said output pulse; circuit connections for impressing said first potential source on said control element of said first valve device for biasing the same so that said first valve device is normally conductive and is rendered non-conductive responsive to said input pulse whereby said tuned circuit means is shocked into oscillation; a second valve device having a control element; an output circuit connected across second and third elements of said second valve device; a second source of direct current potential serially connected with said second and third elements of said second valve device; and circuit connections including half-wave rectifying means having a direct current coupling between said second valve device control element and said second element of said first valve device for impressing said second potential source on said control element of said second valve device for biasing the same so that said second valve device is normally non-conductive and is rendered conductive responsive to and during the first half-cycle of said oscillation of said tuned circuit means thereby to impress across said output circuit a square voltage wave having a duration half the normal period of said tuned circuit.

11. The combination of claim 10 further comprising a capacitor connected between said second element of said second valve device and said control element of said first valve device thereby forming a feedback circuit for maintaining said first valve device non-conductive during said output pulse.

12. A monostable multivibrator circuit for providing one square output voltage pulse of predetermined fixed duration in response to one negative input pulse having a sharply ascending wave front comprising: an input circuit adapated to be connected to a source of said input pulses; a first transistor having its base connected to said input circuit; a parallel-connected tuned circuit having a natural period twice the duration of said output pulse; said tuned circuit being connected between the collector of said first transistor and ground; a source of negative direct current potential and circuit connections for impressing said negative potential source on the emitter and base of said first transistor for biasing the same whereby said first transistor is normally conductive and is rendered non-conductive responsive to said input pulse whereby said tuned circuit is shocked into oscillation; a second transistor having its base directly connected to the collector of said first transistor by a diode; an output circuit connected to the collector of said second transistor; the emitter of said second transistor being connected to ground; and a source of positive direct current potential and circuit connections including a serially connected resistance for impressing said positive potential source on said base and said collector of said second transistor whereby said second transistor is normally non-conductive and is rendered conductive responsive to and during the first half-cycle of oscillation of said tuned circuit thereby to impress on said output circuit an inverse square voltage pulse having a duration half said normal period of said tuned circuit.

13. The combination of claim 12 wherein said diode is polarized to pass current from said source of positive direct current potential when said first transistor is conductive whereby the base of said second transistor is rendered negative and said second transistor is normally non-conductive, said diode blocking said current flow when said tuned circuit begins its first half-cycle of oscillation whereby said base of said second transistor becomes positive and said second transistor is rendered conductive.

14. A monotable multivibrator circuit for providing one square output voltage pulse of predetermined fixed duration in response to one negative input voltage pulse having a sharply ascending wave front comprising: an input circuit adapted to be connected to a source of said input pulses; a first transistor having its base connected to said input circuit; a parallel-connected tuned circuit having a natural period twice the duration of said output pulse; said tuned circuit being connected between the collector of said first transistor and ground; a first source of negative direct current potential and circuit connections for impressing said first negative potential source on the emitter and base of said first transistor for biasing the same whereby said first transistor is normally conductive and is rendered non-conductive responsive to said input pulse whereby said tuned circuit is shocked into oscillation; a second transistor having its base directly connected to the collector of said first transistor by a diode; an output circuit connected to the emitter of said second transistor; a source of positive direct current potential and a second source of negative direct current potential; and circuit connections for impressing said positive potential source on the collector of said second transistor and said second negative potential source on said base of said second transistor whereby said second transistor is normally non-conductive and is rendered conductive responsive to and during the first half-cycle of said oscillation of said tuned circuit thereby to impress on said output circuit an inverse square voltage pulse having a duration half said normal period of said tuned circuit; the emitter of said second transistor being connected to ground by a load resistance.

15. The combination of claim 14 wherein said diode is polarized to block current when said first transistor is conductive whereby the base of said second transistor has a negative potential and said second transistor is normally non-conductive, said diode passing current when said tuned circuit begins its first half-cycle of oscillation whereby said base of said second transistor has a positive potential and said second transistor is rendered conductive.

16. The combination of claim 14 further comprising a break-down diode connected across said load resistance for limiting the voltage of said output pulse.

References Cited in the file of this patent

UNITED STATES PATENTS

| | | |
|---|---|---|
| 2,547,598 | Roshchke | Apr. 3, 1951 |
| 2,772,359 | Modiano | Nov. 27, 1956 |
| 2,852,729 | Kern | Sept. 16, 1958 |
| 2,875,336 | Williams | Feb. 24, 1959 |

FOREIGN PATENTS

| | | |
|---|---|---|
| 762,868 | Great Britain | Dec. 5, 1956 |

OTHER REFERENCES

Suran et al.: July 1955 Proceedings of the IRE Publication (pages 814–820).